United States Patent
Hirano et al.

(10) Patent No.: US 6,190,786 B1
(45) Date of Patent: Feb. 20, 2001

(54) EPOXY RESIN COMPOSITION AND RESIN-ENCAPSULATED SEMICONDUCTOR DEVICE

(75) Inventors: Yasuhiro Hirano; Toshiaki Hayashi, both of Ibaraki (JP)

(73) Assignee: Sumitomo Chemical Company, Ltd., Osaka (JP)

( * ) Notice: Under 35 U.S.C. 154(b), the term of this patent shall be extended for 0 days.

(21) Appl. No.: 09/052,104

(22) Filed: Mar. 31, 1998

(30) Foreign Application Priority Data

Mar. 31, 1997 (JP) .................................... 9-080098
Mar. 31, 1997 (JP) .................................... 9-080099

(51) Int. Cl.$^7$ .................................................. H01L 29/12
(52) U.S. Cl. ........................................... 428/620; 523/466
(58) Field of Search .............................. 523/466; 428/620

(56) References Cited

U.S. PATENT DOCUMENTS 5,458,929  10/1995  Earls et al. .

FOREIGN PATENT DOCUMENTS

739877 * 10/1996 (EP) .

* cited by examiner

Primary Examiner—Robert Dawson
Assistant Examiner—D. Aylward

(74) Attorney, Agent, or Firm—Pillsbury Madison & Sutro LLP

(57) ABSTRACT

Provided is an epoxy resin composition comprising:

(A) an epoxy compound represented by the general formula (1):

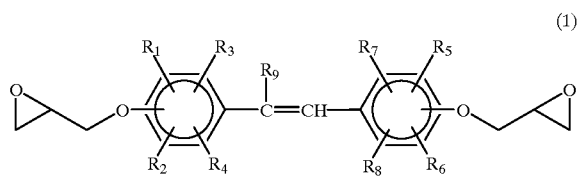

wherein, $R_1$ to $R_9$ represent each independently a hydrogen atom, an acyclic or cyclic alkyl group having 1 to 6 carbon atoms, a substituted or unsubstituted phenyl group or a halogen atom, (B) a polyfunctional epoxy compound having a functional group number of two or more, and (C) an epoxy curing agent containing a phenolic hydroxyl group, wherein the proportion of the epoxy compound (A) is from 1 to 99% by weight based on the total weight of the epoxy compounds (A) and (B).

The epoxy resin composition has low moisture absorption and other properties well-balanced for use as a material for encapsulating electronic parts.

6 Claims, 2 Drawing Sheets

EPOXY RESIN COMPOSITION AND RESIN-ENCAPSULATED SEMICONDUCTOR DEVICE

BACKGROUND OF THE INVENTION

1. Field of the Invention

The present invention relates to an epoxy resin composition which is useful for encapsulating electric and electronic materials, particularly electric parts such as an adhesive, paint, insulation material and laminate.

2. Description of the Related Art

Recently, for encapsulating semiconductors such as LSI, IC, transistor and the like, transfer molding of an economically useful epoxy resin composition is conducted.

Particularly, surface amounting of LSI is recently conducted, and direct immersion into a solder bath is increasing. Since an encapsulating material is exposed to high temperature in this treatment, moisture absorbed in the encapsulating material expands a, crack is formed in the material, and peeling occurs at an interface with a die pat.

Therefore, the epoxy resin encapsulant is required to have low moisture absorption, high crack resistance and improved adhesion. Further, for obtaining low moisture absorption, an epoxy resin of low viscosity in which a filler can be filled in high concentration is desired. Currently, an encapsulating material in which glycidyl ether of o-cresol novolak is used as a polyfunctional epoxy resin and phenol novolak is used as a curing agent is mainly used, however, when the encapsulating material absorbs moisture in storage, the above-described problems occur. Therefore, for avoiding these problems, the encapsulating material is wrapped for preventing moisture absorption in practical use.

On the other hand, a biphenyl type epoxy resin in current use has a lower viscosity and can contain a filler in higher concentration than a polyfunctional epoxy resin, since the biphenyl epoxy resin is a bifunctional epoxy resin and has a low molecular weight. Therefore, moisture absorption depending on the biphenyl type epoxy resin can be reduced and strength thereof can be increased, consequently, excellent crack resistance can be obtained as compared with an epoxy resin in the form of a glycidyl ether of o-cresol novolak. However, the biphenyl type epoxy resin has the problem that the molding property of a cured article thereof is low as compared with the polyfunctional epoxy resin.

There is also a method in which the molding property is improved by combining the current biphenyl type epoxy resin with the cresol novolak type epoxy resin with maintaining the resin viscosity at suitable level, however, the mixture of the biphenyl type epoxy resin and the cresol novolak type epoxy resin becomes semisolid state (honey-like state) and has no definite shape after melt mixing, therefore, handling property of the resin is insufficient. Further, the mixed resin tends to adhere each other, therefore, there is a problem in handling a large amount of the resin.

On the other hand, a dicyclopentadiene type epoxy resin which has curing ability between that of the biphenyl type epoxy resin and that of the cresol novolak type epoxy resin is commercially available. There is a problem that the dicyclopentadiene type epoxy resin has a low melting point and tends to adhere each other, therefore, the resin should be cooled and preserved, consequently, there is also a problem in handling a large amount of the resin as above.

In addition, the dicyclopentadiene type epoxy resin contains a small number of epoxy groups per unit weight of resin, therefore curing and molding property thereof are sometimes insufficient, and further, heat resistance of the cured and molded article are also sometimes insufficient, since the resin has an alicyclic structure derived from non-reactive dicyclopentadiene.

The biphenyl type bifunctional epoxy resin has a problem that curing and molding property is poor since the number of epoxy functional group is small per one molecule, unlike the cresol novolak type polyfunctional epoxy resin. Specifically, Barcole hardness of the biphenyl type resin slightly lowers in molding as compared with the polyfunctional epoxy resin, therefore, a method for enhancing Barcole hardness has been desired.

SUMMARY OF THE INVENTION

An object of the present invention is to provide a resin composition which is an excellent material as an epoxy semiconductor encapsulating material, obtained by using an epoxy resin which has excellent molding property and excellent handling property even at room temperature, and a resin encapsulated semiconductor device using the resin composition.

That is, the present invention is an epoxy resin composition comprising:

(A) an epoxy compound represented by the general formula (1):

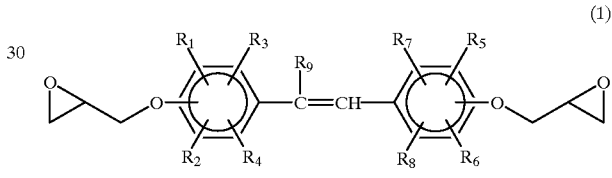

wherein, $R_1$ to $R_9$ represent each independently a hydrogen atom, an acyclic or cyclic alkyl group having 1 to 6 carbon atoms, a substituted or unsubstituted phenyl group or a halogen atom, (B) a polyfunctional epoxy compound having a functional group number of two or more, and (C) an epoxy curing agent containing a phenolic hydroxyl group, wherein the proportion of the epoxy compound (A) is from 1 to 99% by weight based on the total weight of the epoxy compounds (A) and (B).

Further, the present invention relates to a resin-encapsulated semiconductor device obtained by encapsulating a semiconductor element using the above epoxy resin composition.

DETAILED DESCRIPTION OF THE INVENTION

Figure 1:
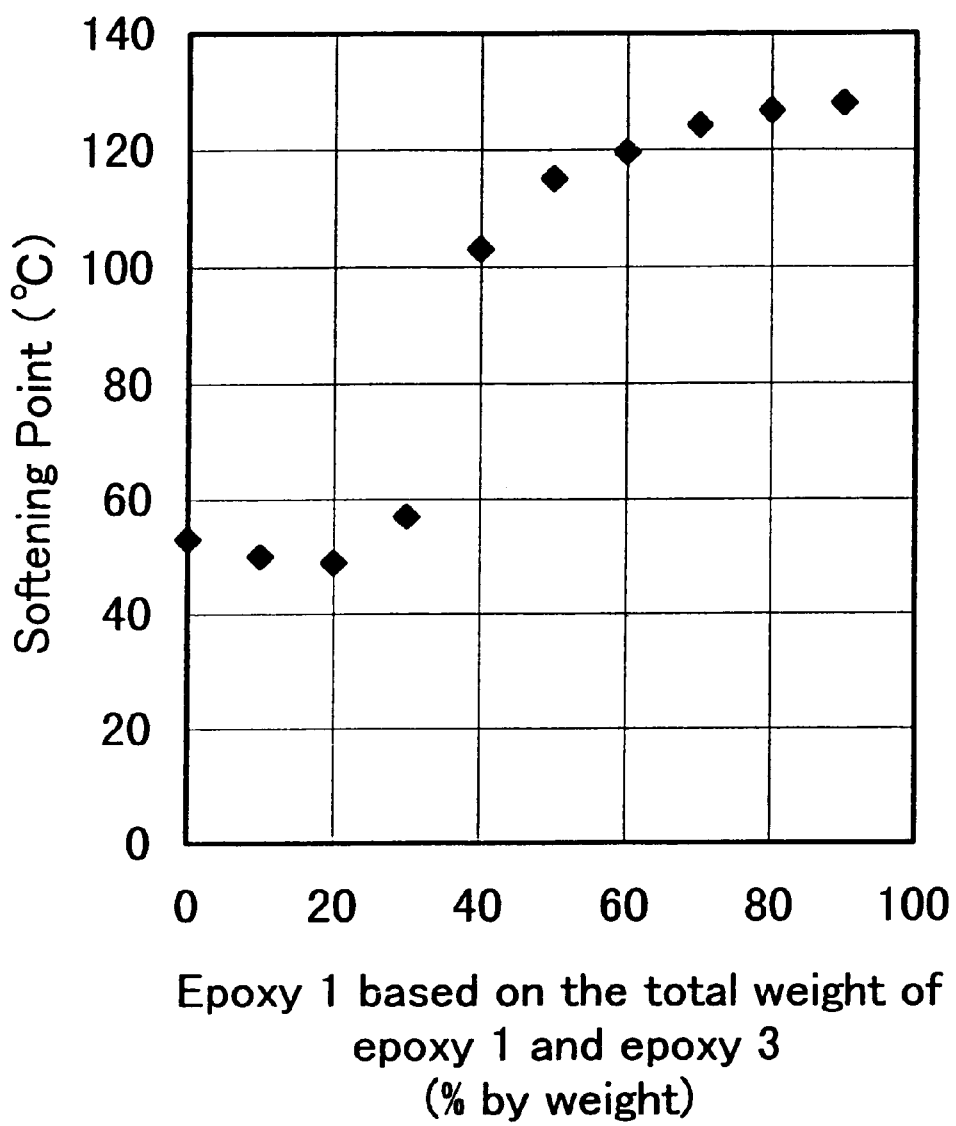
FIG. 1 is a graph showing the relation between the softening point and the mixing ratio of the epoxy resins.

Specific examples of the respective substituents $R_1$ to $R_9$ of the epoxy resin represented by the general formula (1) used in the present invention include methyl group, ethyl group, propyl group, butyl group, amyl group, hexyl group, cyclohexyl group, phenyl group, tolyl group, xylyl group (including respective isomers), chlorine atom, bromine atom and the like.

The epoxy resin represented by the general formula (I) can be obtained by glycidyl-etherifying stilbenephenols according to a conventional method.

A publication (von Rolf H. Sieber, Liebigs Ann. Chem. 730, 31 to 46 (1969)) discloses a production method of a stilbene-based bisphenol compound which is a raw material of the epoxy resin, and physical properties of compounds such as 4,4'-dihydroxystilbene, 4,4'-dihydroxy-3,3'-dimethylstilbene, 4,4'-dihydroxy-3,3',5,5'-tetramethylstilbene and the like. Another literature (METHODEN DER ORGANISCHEN CHEMIE (HOUBEN-WEYL) BAND IV/1c Phenol Teil 2 P1034) describes a production method of 4,4'-dihydroxy-α-methylstilbene, etc. using phenol and chloroacetone as a starting material.

Specific examples of the stilbene-based phenols used as a raw material of the epoxy resin represented by the general formula (1) include 4,4'-dihydroxy-3-methylstilbene, 4,4'-dihydroxy-3-ethylstilbene, 4,4'-dihydroxy-3-propylstilbene, 4,4'-dihydroxy-3-amylstilbene, 4,4'-dihydroxy-3-hexylstilbene, 4,4'-dihydroxy-2,3-dimethylstilbene, 4,4'-dihydroxy-2,6-dimethylstilbene, 4,4'-dihydroxy-2,3'-dimethylstilbene, 4,4'-dihydroxy-3,3',5-trimethylstilbene, 4,4'-dihydroxy-3,3',5-trimethylstilbene, 4,4'-dihydroxy-3,3',5,5'-tetramethylstilbene, 4,4'-dihydroxy-2',3,5,6'-tetramethylstilbene, 3-t-butyl-4,4'-dihydroxy-3'-methylstilbene, 3-t-butyl-4,4'-dihydroxy-5,3'-dimethylstilbene, 3-t-butyl-4,4'-dihydroxy-3',6-dimethylstilbene, 3-t-butyl-4,4'-dihydroxy-3'-methyl-5-propylstilbene, 3-t-butyl-4,4'-dihydroxy-5-butyl-3'-methylstilbene, 3-t-butyl-4,4'-dihydroxy-5-amyl-3'-methylstilbene, 3-t-butyl-4,4'-dihydroxy-5-hexyl-3'-methylstilbene, 3-t-butyl-4,4'-dihydroxy-5-cyclohexyl-3'-methylstilbene, 3-t-butyl-4,4'-dihydroxy-3,5,5'-trimethylstilbene, 3-t-butyl-2,4'-dihydroxy-3',5',6-trimethylstilbene, 3-t-butyl-4,4'-dihydroxy-3',5',6-trimethylstilbene, 3-t-butyl-4,4'-dihydroxy-3',5-dimethyl-5'-propylstilbene, 3-t-butyl-4,4'-dihydroxy-3',6-dimethyl-5'-propylstilbene, 4,4'-dihydroxy-3,3'-dimethylstilbene, 3,3'-diethyl-4,4'-dihydroxystilbene, 4,4'-dihydroxy-3,3'-dipropylstilbene, 3,3'-diamyl-4,4'-dihydroxystilbene, 3,3'-dihexyl-4,4'-dihydroxystilbene, 3,3'-dicyclohexyl-4,4'-dihydroxystilbene, 2,2'-dihydroxy-3,3',5,5'-tetramethylstilbene, 4,4'-dihydroxy-3,3',5,5'-tetramethylstilbene, 4,4'-dihydroxy-3,3'-di-t-butylstilbene, 4,4'-dihydroxy-3,3'-di-t-butyl-5,5'-dimethylstilbene, 4,4'-dihydroxy-3,3'-di-t-butyl-6,6'-dimethylstilbene, 2,2'-dihydroxy-3,3'-di-t-butyl-6,6'-dimethylstilbene, 2,4'-dihydroxy-3,3'-di-t-butyl-6,6'-dimethylstilbene, 4,4'-dihydroxy-3,3',5,5'-tetra-t-butylstilbene and the like (including isomers having different substitution position). Epoxy compounds of α-methylstilbene obtained by substituting a carbon atom on a carbon—carbon double bond of these stilbene compounds with a methyl group are also exemplified. Among these compounds, 2,2'-dihydroxy-3,3',5,5'-tetramethylstilbene, 4,4'-dihydroxy-3,3',5,5'-tetramethylstilbene, 4,4'-dihydroxy-3,3',5,5'-tetramethyl-α-methylstilbene, 4,4'-dihydroxy-3,3'-di-t-butyl-5,5'-dimethylstilbene, 4,4'-dihydroxy-3,3'-di-t-butyl-6,6'-dimethylstilbene, 2,2'-dihydroxy-3,3'-di-t-butyl-6,6'-dimethylstilbene, 2,4'-dihydroxy-3,3'-di--t-butyl-6,6'-dimethylstilbene, 3-t-butyl-4,4'-dihydroxy-3',5,5'-trimethylstilbene, 3-t-butyl-2,4'-dihydroxy-3',5',6-trimethylstilbene and 3-t-butyl-4,4'-dihydroxy-3',5',6-trimethylstilbene are particularly preferable from the viewpoints of ease of synthesis, performances, and price of the raw material.

These epoxy resins are obtained by reacting bisphenols with an epihalohydrin in the presence of an alkaline such as sodium hydroxide and the like. Particularly, when an epoxy resin having high purity is obtained, a reaction in the presence of an aprotic solvent is suitable as described in Japanese Patent Application Laid-Open (JP-A) No. 60-31,517.

In the epoxy resin composition of the present invention, as polyfunctional epoxy compound (B) having a functional group number of two or more, there can be used known compounds, and examples thereof include novolak-based epoxy resins which are reaction products of formaldehyde with phenols such as phenol, o-cresol and the like; glycidyl ether compounds derived from three or more-functional phenols such as phloroglycine, tris-(4-hydroxyphenyl)-methane, 1,1,2,2-tetrakis(4-hydroxyphenyl)ethane and the like; glycidyl ether compounds of polyhydric phenols obtained by condensation reaction of phenols with aromatic carbonyl compounds; amine-based epoxy resins derived from p-aminophenol, m-aminophenol, 4-aminomethacresol, 6-aminomethacresol, 4,4'-diaminodiphenylmethane, 3,3'-diaminodiphenylmethane, 4,4'-diaminodiphenyl ether, 3,4'-diaminodiphenyl ether, 1,4-bis(4-aminophenoxy)benzene, 1,4-bis(3-aminophenoxy)benzene, 1,3-bis(4-aminophenoxy)benzene, 1,3-bis(3-aminophenoxy)benzene, 2,2-bis(4-aminophenoxyphenyl)propane, p-phenylenediamine, m-phenylenediamine, 2,4-toluenediamine, 2,6-toluenediamine, p-xylylenediamine, m-xylylenediamine, 1,4-cyclohexanebis(methylamine), 1,3-cyclohexanebis(methylamine) and the like, and one or more of these epoxy resins are used. Among them, novolak-based epoxy resins which are reaction products of folmaldehyde with phenols such as phenol, o-cresol and the like, and glycidyl ether compounds of polyhydric phenols containing a trismethane group obtained by condensation reaction of phenols with aromatic carbonyl compounds are particularly preferable in view of heat resistance, easy availability and cost.

The resin composition of the present invention may contain glycidyl ester-based compounds derived from aromatic carboxylic acids such as p-oxybenzoic acid, m-oxybenzoic acid, terephthalic acid, isophthalic acid and the like, such as bisphenol A, bisphenol F, tetramethylbiphenol, hydroquinone, resorcin, 4,4'-thiodi(2,6-dimethylphenol), dihydroxynaphthalene, bis(hydroxyphenyl)dicyclopentane, bis(hydroxyphenyl)menthane and the like; hydantoin-based epoxy compounds derived from 5,5-dimethylhydantoin and the like; alicyclic epoxy resins such as 2,2-bis(3,4-epoxycyclohexyl)propane, 2,2-bis[4-(2,3-epoxypropyl)cyclohexyl]propane, vinylcyclohexene dioxide, 3,4-epoxycyclohexylmethyl-3,4-epoxycyclohexane carboxylate and the like; divalent glycidyl ether compounds such as diglycidyl ether compounds and the like derived from dihydric phenols such as N,N-diglycidylaniline and the like, amines or halogenated bisphenols such as tetrabromobisphenol A and the like. Further, the resin composition of the present invention may also contain cyanate resins such as 2,2-bis(4-cyanatephenyl)propane and the like.

The epoxy resin component of the present invention is obtained by mixing the stilbene-based epoxy compound (A) represented by the general formula (1) with the polyfunctional epoxy compound (B).

The content of the epoxy compound (A) is, for example, from 1 to 99% by weight, preferably from 20 to 99% by weight, and more preferably from 30 to 90% by weight based on the total amount of the epoxy compound (A) and the epoxy compound (B).

If only the polyfunctional epoxy compound (B) is used, melt viscosity of the resin is high, therefore, when a filler is used in large amount, flowing property of the whole resin composition in heat-melting becomes low, molding property deteriorates, gloss on the surface of the cured molded article disappears, and sometimes, unfilled portion is formed in the cured material. By combining the stilbene-based epoxy compound (A) with the polyfunctional epoxy compound (B), high filling with a filler which is difficult when the polyfunctional epoxy is used alone can be easily accomplished, and in addition, a cured material having excellent molding property is obtained.

When the content of the epoxy compound (A) is, for example, from 1 to 60% by weight based on the total amount of the epoxy compound (A) and the epoxy compound (B), flowing property of the whole composition is improved and a molded article having high Barcole harness can be obtained. The content of the epoxy compound (A) is preferably from 20 to 60% by weight, and more preferably from 30 to 60% by weight which are epoxy resin components. When the content is lower than 1% by weight, the softening point becomes lower to make the handling property insufficient.

The epoxy compound (A) has a low melt viscosity and can contain a large amount of filler without deteriorating flowing property of the whole resin composition, but the epoxy compound (A) alone, sometimes cannot afford a molded article having high Barcole hardness. By combining the polyfunctional epoxy compound (B) with the stilbene-based epoxy compound (A), it becomes possible to increase crosslinking density to make the Barclole hardness high.

For the above purpose, the content of the polyfunctional epoxy compound (B) is, for example, from 1 to not more than 40% by weight based on the total amount of the epoxy compound (A) and the epoxy compound (B), preferably from 1 to 30% by weight, and more preferably from 10 to 30% by weight. When the content is lower than 1% by weight, the effect of improving Barcole hardness is insufficient.

The epoxy compound (A) of the present invention has a melt viscosity at 150° C. of preferably less than 1 poise, and more preferably less than 0.5 poise. The polyfunctional epoxy compound (B) has a melt viscosity at 150° C. of preferably less than 10 poise, and more preferably less than 5 poise.

In practical use, the epoxy compound (A) and the polyfunctional epoxy resin (B) may be mixed with a filler and the like, or the epoxy components may be previously melted and mixed or may be melted and mixed previously with the resin component (C) such as an epoxy curing agent and the like before use.

As the epoxy curing agent (C), known curing agents can be used. Examples thereof include polyhydric phenols such as phenol novolak and the like, amine-based curing agents such as dicyanediamide, diaminodiphenylmethane, diaminodiphenylsulfone and the like, acid anhydride curing agents such as pyromellitic anhydride, trimellitic anhydride, benzophenonetetracarboxylic acid, and the like, and in view of moisture resistance, polyhydric phenols are preferable. Further, examples of polyhydric phenols as the epoxy curing agent include polycondensates of one or more phenols such as phenol, various alkylphenols, naphthol and the like with aldehydes such as formaldehyde, acetaldehyde, acrolein, glyoxal, benzaldehyde, naphthaldehyde, hydroxybenzaldehyde and the like or ketones such as cyclohexanone, acetophenone and the like; vinyl polymerization type polyhydric phenols such as polyvinylphenol, polyisopropenylphenol and the like; reaction products of phenols with diols such as a compound represented by the following formula

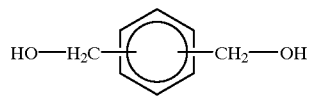

and the like or dialkoxys such as a compound represented by the following formula

in the formula, R represents an acyclic or cyclic alkyl group having 1 to 6 carbon atoms, or substituted or unsubstituted phenyl group, and the like, or dihalogens such as a compound represented by the following formula

in the formula, X represents a halogen atom selected from fluorine, chlorine, bromine and iodine, and the like; and Friedel Crafts type reaction products of phenols with diolefins such as dicyclopentadiene, diisopropenylbenzene and the like, and phenol novolak is particularly preferred in view of workability and curing property. These curing agents can be used alone or in combination of two or more.

Usually, the amount of the curing agent is preferably from 0.7 to 1.2 equivalent based on the epoxy resin. When the amount is less than 0.7 equivalent, or more than 1.2 equivalent, curing is incomplete in either case.

When the epoxy resin composition of the present invention is cured, known curing accelerators can be used.

Examples of these accelerators include, but not limited to, organic phosphine compounds such as triphenylphosphine, tri-4-methylphenylphosphine, tri-4-methoxyphenylphosphine, tributylphosphine, trioctylphosphine, tri-2-cycnoethylphosphine and the like and tetraphenyl borate salts thereof; tert-amines such as tributylamine, triethylamine, 1,8-diazabicyclo(5,4,0) undecene-7, triamylamine and the like; quaternary ammonium salts such as benzyltrimethylammonium chloride, benzyltrimethylammonium hydroxide, triethylammoniumtetraphenyl borate and the like; imidazoles, and the like. Among them, organic phosphine compounds, 1,8-diazabicyclo(5,4,0)undecene-7, and imidazoles are preferred in view of moisture resistance and curing property, and triphenylphosphine is particularly preferred.

Examples of the inorganic filler (D) in the epoxy resin composition of the present invention include silica, alumina, titanium white, aluminum hydroxide, talc, clay, glass, fiber and the like, and in particular, silica and alumima are preferred. These fillers having different form (spherical or crushed type) or different size may also be mixed to increase filling amount for use.

In view of moisture resistance and molding property, the compounding ratio of the inorganic filler is from 25 to 95% by weight based on the total amount of the resin composition, preferably from 50 to 95% by weight, more preferably from 70 to 95% by weight, and more preferably from 80 to 92% by weight.

In the case of using a spherical powder as the inorganic filler, the form may advantageously be substantial sphere containing no sharp angle and having an aspect ratio of 1.0 to 1.2. A sphere having sphericity near that of a commercially available spherical silica powder produced by a spray coating method or sol-gel method is preferred, and a sphere having sphericity more close to that of a real sphere is more preferable. When sphering treatment is difficult, the inorganic material is processed into a fine powder, and then formed to a spherical powder by a mechanochamichal method with adding a binder to the powder.

The form of the crushed powder may be heteromorphic body such as a polyhedron having angle and the like. Among other, amorphous or crystalline quarts crushed powders obtained by grinding a synthetic or natural quarts lump is suitable, and specifically, fused crushed-silica and the like are suitable.

As the spherical powder used in the present invention, any powder can be used, and as one example, which composed of three groups, namely, x, y and z components, will be described. The x, y and z components have an average particle size from 0.1 to 1.5 μm, an average particle size from 2 to 15 μm and an average particle size from 20 to 70 μm respectively, and more preferably an average particle size from 0.1 to 1.0 μm, an average particle size from 2 to 10 μm and an average particle size from 20 to 50 μm respectively. When a powder having an average particle size of less than 0.1 μm is used, due to flocculation of the powder each other, sometimes uniform dispersion in the resin composition becomes difficult and flowing property is lost, and the powder having an average particle size of over 70 μm can not easily filled in fine part of a semiconductor element. When respective average particle sizes of the x, y and z components are out of the above-described ranges, flowing property of the resin composition lowers. It is preferable that the particle size distribution of each spherical powder used in the present invention is narrower, and further, a powder of monodistribution system is preferred. Therefore, it is preferable to use a powder in which x, y and z components are treated for uniforming respective particle sizes by sieving operation. The average particle size is defined as a 50% diameter of cumulative particle distribution measured by using an apparatus such as a laser scattering particle size distribution measuring apparatus and the like.

Regarding the compounding ratio of the spherical powders x, y and z, ratios by volume of the x, y and z components based on the calculated total volume of the x, y and z components may be advantageously from 10 to 24% by volume, from 0.1 to 66% by volume and from 24 to 76% by volume respectively, and more advantageously from 10 to 24% by volume, from 0.1 to 36% by volume and from 57 to 76% by volume respectively, and more preferably from 10 to 20% by volume, from 4 to 30% by volume and from 60 to 76% by volume respectively. When the ratios are out of these ranges, flowing property of the resin composition lowers.

The aforesaid descriptions of % by weight in the present invention are obtained by calculation using values obtained by dividing respective weights of the w, y and z components by respective true specific gravity, as volumes of respective components. In general, the apparent volume of a particle having particle size distribution changes depending on manner for filling into a measuring vessel, and when aggregates of heterogeneous particles are mixed, the apparent volumes before and after the mixing are different. Therefore, in the above-described description, apparent volume is not used in calculation of % by volume of each component of the particle aggregate.

The crushed powder (m component) used in the present invention has an average particle size of 1 to 70 μm, preferably 1 to 30 μm. Regarding the compounding ratio of the crushed powder (m component), the ratio by weight of the m component based on the total weight of the spherical powder component and the crushed powder m component is preferably from 1 to 30% by weight. When the compounding ratio is lower than this range, effect for decreasing fin or flash (a resin thin film due to flowing out of a resin component) generated depending on kind of the resin, and forms of an encapsulating apparatus and mold is poor, and when over this range, flowing property of the resin composition decreases.

It is preferable that the fillers used in the present invention is sufficiently previously mixed. Specifically, the mixing can be conducted by using an apparatus such as a mixer, cokneader and the like utilizing a rotating blade or air, an apparatus which vibrates, shakes or rotates a vessel, and the like. For judging whether the fillers are fully kneaded or not, it may be advantageous that particle size distributions of samples in different places are measured, and whether they are substantially the same or not is checked. Further, optionally, the filler may be previously treated with a coupling agent or a resin, for use. As the treatment method, there is a method in which mixing is conducted using a solvent, then the solvent is distilled off, and a method in which the coupling agent or the resin is directly mixed with the filler, and the mixture is treated using a mix.

In the epoxy resin composition of the present invention, in addition, a mold-releasing agent such as natural wax, synthetic wax, higher fatty acid and metal salt thereof, or paraffin and the like, or a coloring agent such as carbon black, and further, a surface treating agent such as a silane coupling agent and the like, may be optionally added. Further, a flame retardant such as antimony trioxide, phosphorus compound, brominated epoxy resin and the like may be added. For exhibiting flame retardant effect, a brominated epoxy resin is particularly preferable.

Further, for lowering stress, various elastomers may be added or previously reacted for use. Examples thereof include addition type or reaction type elastomers and the like such as polybutadiene, butadiene-acrylonitrile copolymer, silicone rubber, silicone oil and the like.

For encapsulating electronic parts such as a semiconductor and the like and producing a resin encapsulated semiconductor device using the epoxy resin composition of the present invention, curing-molding may advantageously be effected by a conventionally known molding method such as transfer mold, compression mold, injection mold and the like.

EXAMPLES

The following examples illustrate the present invention, but do not limit the scope thereof.

Evaluation methods of a kneaded material and cured article are as follows.

Barcole hardness: It was measured by a 935 type hardness measuring apparatus under conditions of 175° C./90 seconds according to ASTM D-648.

Tg (glass transition temperature): It was measured using TMA.

Water absorption: Change in weight was measured under conditions of 85° C./85% RH using a thermo-hygrostat (AGX-326 manufactured by Advantech Toyo Corp.)

Spiral flow: It was measured under conditions of 175° C./70 kg/cm$^2$ according to EMMI-1-66.

Solder heat resistance: It is represented by number of IC samples on which crack was generated after immersion into a solder bath at 240° C. for 30 seconds directly after moisture absorption by simulated ICs (52 pin QFP package: package thickness 2.05 mm) under conditions of 85° C./85% RH. Number of samples: 10.

The following examples illustrate the present invention, but do not limit the scope thereof.

In the examples, the epoxy equivalent is defined by molecular weight of an epoxy resin per one epoxy group.

Reference Example 1

(1) Synthesis of 1,1-Bis(Hydroxyphenyl)-2-Chloroethane

To a 2-liter four-necked flask equipped with a thermometer, stirrer and condenser were added 244.4 g (2.0 mol) of 2,6-xylenol (hereinafter, abbreviated as 26 XY), 193.8 g (1.0 mol) of 40.5% aqueous chloroacetoaldehyde solution and 376 g of acetic acid, and the mixture was stirred for dissolution and cooled to 5° C. Then, to this was added dropwise a solution prepared by mixing 122 g (1.2 mol) of concentrated sulfuric acid with 84 g of acetic acid at 5° C. over 3 hours, then the reaction system was maintained at 25° C. for 6 hours, and stirring of the reaction system was continued overnight at room temperature. The temperature of the system was cooled to 5° C., and the precipitated crystal was separated by filtration. The crystal was washed with 500 g of water six times, then dried under reduced pressure at 40° C. for 8 hours to obtain 264 g (yield 86.6%) of a colorless crystal (referred to as XYCE). The purity measured by gel permeation chromatography (hereinafter, abbreviated as GPC, detected by 254 nm ultraviolet ray) was 98.3%, and wide absorption due to a hydroxyl group was recognized around 3500 cm$^{-1}$ by infrared spectrum. Further, a fragment having a molecular weight of 304 was observed by mass spectrum.

(2) Synthesis of Stilbene-based Bisphenol

To a 1-liter four-necked flask equipped with a thermometer, stirrer and condenser were added 225.6 g of XYCE and 451.2 g of methanol, and the mixture was stirred for dissolution under nitrogen flow. To this was added dropwise 91.9 g of 48.3% aqueous sodium hydroxide solution at an inner temperature of 30° C. for 1 hour. Then, the temperature of the mixture was raised and the mixture was reacted for 3 hours under reflux of methanol. After the reaction, high performance liquid chromatography (hereinafter, abbreviated as LC) recognized that the raw material XYCE completely disappeared. After cooling to 60° C., 37.5 g of concentrated hydrochloric acid was added for neutralization, and methanol was distilled off. Then, 1000 g of hot water was added, and the precipitated crystal was obtained by filtration. The crystal was washed with water before drying under reduced pressure for 8 hours at 80° C., to obtain 192 g (96.7%) of a yellow crystal (XYSB). The purity measured by GPC was 98.1%, and wide absorption due to a hydroxyl group was recognized around 3400 cm$^{-1}$ by infrared spectrum. Further, a fragment having a molecular weight of 268 was observed by mass spectrum.

(3) Synthesis of Epoxy Compound 100 g of the raw material phenol (XYSB) obtained in (2) was charged into a reaction vessel equipped with a thermometer, stirrer, dropping funnel and condenser having a separation tube, and was dissolved in 485.6 g of epichlorohydrin and 242.8 g of 1,4-dioxane. To this was added dropwise 61.71 g of 48.3% sodium hydroxide continuously at 62° C. with maintaining the inner pressure of the system at 140 torr. During this procedure, the system was reacted with maintaining the temperature at 62° C., cooling and liquefying epichlorohydrin and water azeotropically, and returning the organic layer back into the system.

After completion of the reaction, unreacted epichlorohydrin and 1,4-dioxane were removed by concentration under reduced pressure, and the by-produced salt and glycidyl ether were dissolved in 800 g of methyl isobutyl ketone, and the by-produced salt and dimethylsulfoxide were removed by washing with water. Then, methyl isobutyl ketone was distilled off under reduced pressure of 10 torr at 160° C., to obtain 122.2 g (86.2%) of an desired product (referred to as XYCC-E).

The purity measured by GPC (detected by differential refractive index measuring apparatus) was 93.0%, the melting point was 151° C., and the epoxy equivalent was 198 g/eq. As a result of infrared absorption spectrum measurement, it was recognized that absorption due to a phenolic hydroxyl group disappeared, and absorption at 1240 cm$^{-1}$ and 915 cm$^{-1}$ due to epoxy existed.

Reference Example 2

(1) Synthesis of 1,1-Bis(Hydroxyphenyl)-2-Chloroethane Derivative

The same procedure as in Reference Example 1 (1) was conducted except that 195.5 g (1.6 mol) of 26XY and 65.7 g (0.4 mol) of 3M6B were used instead of 244.4 g (2.0 mol) of 2,6-XY, to obtain 271 g (yield 84.1%) of a pale violet crystal (referred to as XMCE-20). The purity measured by GPC (detected by 254 nm ultraviolet ray) was 97.7%, and wide absorption due to a hydroxyl group was recognized around 3450 and 3550 cm$^{-1}$ by infrared spectrum. Further, fragments having a molecular weight of 346 and 304 were observed by mass spectrum.

(2) Synthesis of Stilbene-based Bisphenol

The same procedure as in Reference Example 1 (2) was conducted except that 144.8 g of XMCE-20 obtained in Reference Example 2 (1) was used instead of XYCE, to obtain 124 g (yield 96.6%) of a yellow crystal (referred to as XMSB-20). The purity measured by GPC (detected by 254 nm ultraviolet ray) was 97.1%, and wide absorption due to a hydroxyl group was recognized around 3400 cm$^{-1}$ by infrared spectrum. Further, fragments having a molecular weight of 310 and 268 were observed by mass spectrum.

(3) Synthesis of Epoxy Compound

The same procedure as in Reference Example 1 (3) was conducted except that 99.7 g of XMSB-20 obtained in the above-described (2) was used instead of XYSB, to obtain 131 g (yield 94%) of an desired product (referred to as XMCC-20).

The purity measured by GPC (detected by differential refractive index measuring apparatus) was 93.6%, and the content of the stilbene-based epoxy compound containing 26XY and 3M6B in the molecule was 39.6%. The melting point was 110 to 130° C., and the epoxy equivalent was 208 g/eq. As a result of infrared absorption spectrum measurement, it was recognized that absorption due to a phenolic hydroxyl group disappeared, and absorption at $1240$ cm$^{-1}$ and $920$ cm$^{-1}$ due to epoxy existed.

Examples 1–6 and Comparative Examples 1–2

The epoxy compound obtained in Reference Example 2 (referred to as "epoxy 1"), glycidyl ethers of orthocresol novolak (compounds having a melt viscosity at 150° C. of Further, the molded article was subjected to post curing in an oven at 180° C. for 5 hours to obtain a cured molded article.

The physical properties of this cured molded article were measured, and the results are shown in Table 1. Regarding finished property, the case in which mist and stain were formed on the mold was represented by X, and the case in which mist and stain were not formed on a mold was represented by ○. In the table, the term "molding failure" indicates the case in which unfilled portion and void were formed in the package.

TABLE 1

|  |  |  | Example | | | | | | Comparative example | |
|---|---|---|---|---|---|---|---|---|---|---|
|  |  |  | 1 | 2 | 3 | 4 | 5 | 6 | 1 | 2 |
| Content of epoxy 2 or 3 (% by weight) (wt %) | | | 75 | 50 | 75 | 50 | 75 | 50 | 100 | 100 |
| Filler content (% by weight) (wt %) | | | 80 | 80 | 82.5 | 82.5 | 85 | 85 | 80 | 85 |
| Epoxy 1 | | | 25 | 50 | 25 | 50 | 25 | 50 | — | — |
| Epoxy 2 | | | 75 | 50 | 75 | 50 | 75 | 50 | 100 | — |
| Epoxy 3 | | | — | — | — | — | — | — | — | 100 |
| Phenol novolak | | | 53.51 | 52.66 | 53.51 | 52.66 | 53.51 | 52.66 | 53.51 | 53.01 |
| TPP | | | 1.5 | 1.5 | 1.5 | 1.5 | 1.5 | 1.5 | 1.5 | 1.5 |
| SH-6040 | | | 2.0 | 2 | 2 | 2 | 2 | 2 | 2 | 2 |
| Carnauba wax | | | 1.5 | 1.5 | 1.5 | 1.5 | 1.5 | 1.5 | 1.5 | 1.5 |
| Fused silica | | | 491.23 | 488.51 | 478.95 | 575.75 | 695.91 | 692.06 | 493.95 | 693.6 |
| Crushed silica | | | 122.81 | 122.13 | 144.74 | 143.94 | 173.98 | 173.01 | 123.49 | 173.4 |
| Molding property | | | ○ | ○ | ○ | ○ | Δ | ○ | Δ | Δ |
| Spiral flow | | | 36 | 41 | 32.5 | 32.5 | 20 | 20 | 30 | 18 |
| Barcole hardness | | | 91 | 88 | 91 | *8 | 91 | 91 | 91 | 90 |
| Tg | TMA | ° C. | 150 | 150 | 151 | 140 | 147 | 137 | 152 | * |
| water absorption | 16 hr. | % | 0.2094 | 0.2208 | 0.1935 | 0.1894 | 0.1734 | 0.1645 | 0.2077 | * |
|  | 20 hr. | % | 0.2394 | 0.2226 | 0.2032 | 0.2006 | 0.1798 | 0.1833 | 0.2246 | * |
|  | 24 hr. | % | 0.2710 | 0.2607 | 0.2354 | 0.2273 | 0.2119 | 0.2044 | 0.2789 | * |
| Bending at room | Strength | Kg/mm$^2$ | 14.3 | 14.1 | 16.64 | 15.57 | 12.52 | 12.08 | 14.9 | * |
| temperature | Elastic modulus | Kg/mm$^2$ | 1270 | 1730 | 1905 | 1897 | 2003 | 1999 | 1785 | * |
| R.T. | Deflection |  | 0.0087 | 0.0089 | 0.0102 | 0.0098 | 0.0074 | 0.0069 | 0.0096 | * |
| Bending at 240° C. | Strength | Kg/mm$^2$ | 7.31 | 7.63 | 9.75 | 8.39 | 12.09 | 10.06 | 8.95 | * |
|  | Elastic modulus | Kg/mm$^2$ | 789 | 701 | 891 | 768 | 1205 | 1170 | 839 | * |
|  | Deflection |  | 0.0088 | 0.0125 | 0.0117 | 0.0116 | 0.0111 | 0.0101 | 0.011 | * |
| Solder Cracking | Water absorption | % | 0.21 | 0.22 | 0.19 | 0.19 | 0.17 | 0.16 | 0.21 | * |
| (16 hr) | Crack | % | 0 | 0 | 0 | 0 | 0 | 0 | 0 | * |
| Solder Cracking | Water absorption | * | 0.22 | 0.22 | 0.20 | 0.20 | 0.18 | 0.18 | 0.22 | * |
| (20 hr) | Crack | % | 0 | 0 | 0 | 0 | 0 | 0 | 70 | * |
| Solder Cracking | Water absorption | % | 0.27 | 0.26 | 0.24 | 0.23 | 0.21 | 0.20 | 0.28 | * |
| (24 hr) | Crack | % | 30 | 10 | 0 | 0 | 0 | 0 | 80 | * |

*mark: Molding failure (foaming or toughness on molding surface) such as void and the like occurred, and measurement was impossible 2.7 poise and 1 poise are referred to as "epoxy 2" and "epoxy 3" respectively, trade name: Sumiepoxy ESCN-195 manufactured by Sumitomo Chemical Co., Ltd., epoxy equivalent were 195 g/eq and 200 g/eq respectively), phenol novolak (trade name: Tamanol 758, manufactured by Arakawa Kagaku Kogyo Corp.) as a curing agent, aralkylphenol resin (trade name: Milex, manufactured by Mitsui Toatsu Chemicals, Inc.), triphenylphosphine as a curing accelerator, fused silica (grade of the silica is shown below) as a filler, carnauba wax as a mold-releasing agent, and coupling agent (trade name: SH-6040, manufactured by Dow Corning Toray Silicone Co., Ltd.) were compounded in amounts (g) shown in Table 1, and the mixture was kneaded with heating by a roll, then subjected to transfer molding. As the filler, a material obtained by compounding 20% by weight of crushed silica FS891 (manufactured by Denki Kagaku Kogyo K.K.) with 80% by weight of fused silica FS20 (manufactured by Denki Kagaku Kogyo K.K.) was used.

Examples 7 to 10 and Comparative Examples 3 to 5

The same evaluations as in Table 1 were conducted, except that tetramethylbiphenyl type epoxy (epoxy equivalent: 193 g/eq, melt viscosity at 150° C.: 0.1 poise) was used as the epoxy 4, a glycidyl etherified compound of polyphenol which is a reaction condensate of phenol with dicyclopentadiens (epoxy equivalent: 264 g/eq, melt viscosity at 150° C.: 0.6 poise) was used as the epoxy 5, a mixture prepared by compounding 1, FS-20: crushed silica (average particle size 5.6 μm) manufactured by Denki Kagaku Kogyo K.K., 2, Adomafine SO-C2: spherical silica (average particle size 0.4 μm) manufactured by Adomateck Corp., 3, Silstar MK-06: spherical silica (average particle size 4.9 μm) manufactured by Nippon Chemical Industry, Co., Ltd., and 4, Excelica SE-40: spherical silica (average particle size 40.4 μm) manufactured by Tokuyama Soda Corp., in a formulation of 1: 10% by weight, 2: 10.8% by weight, 3: 18% by weight and 4: 61.2% by weight was used as the mixed silica (fillers in Table 2, represented as mixed filler). The drawing adhesion at 240° C. was represented by force used for drawing out 42 alloy (iron-nickel alloy) at 240° C. after the alloy was buried using the resin composition prepared in each example (according to JIS K69911, K6849).

In the solder test, a tip was mounted on a simulated IC (52 pin QFP package) and then encapsulated, and evaluation was effected regarding samples having a package thickness of 1.5 mm, 2 mm and 2.7 mm. Ten packages were used, moisture absorption was conducted under conditions of 85° C. and humidity 60% for 168 hours, and the package was

TABLE 2

| | | | Example | | | | Comparative example | | |
|---|---|---|---|---|---|---|---|---|---|
| | | | 7 | 8 | 9 | 10 | 3 | 4 | 5 |
| Filler content (% by weight) (wt %) | | | 90 | 90 | 90 | 90 | 90 | 88 | 88 |
| Epoxy 1 | | | 30 | 40 | 50 | 60 | — | — | — |
| Epoxy 3 | | | 70 | 60 | 50 | 40 | 50 | — | 100 |
| Epoxy 4 | | | — | — | — | — | 50 | — | — |
| Epoxy 5 | | | — | — | — | — | — | 100 | — |
| Phenol novolak | | | 52.32 | 52.09 | 51.98 | 51.63 | 54.02 | 40.15 | 53.01 |
| TPP | | | 1.5 | 1.5 | 1.5 | 1.5 | 1.5 | 1.5 | 1.5 |
| SH-6040 | | | 4.4 | 4.4 | 4.4 | .4 | 4.47 | 3.39 | 3.7 |
| Carnauba wax | | | 3.3 | 3.3 | 3.3 | 3.3 | 3.36 | 2.55 | 2.8 |
| Mixed silica | | | 1370.8 | 1368.8 | 1367.8 | 1364.7 | 1386.16 | 1027.78 | 1122 |
| Molding property | | | ○ | ○ | ○ | ○ | ○ | ○ | ○ |
| Spiral flow | | inch | 25 | 31 | 29 | 31 | 29 | 31.2 | 29.5 |
| Barcole hardness | | | 89 | 89 | 89 | 88 | 89.5 | 82 | 90 |
| Tg | DMA (tan δ) | ° C. | 157 | 158 | 158 | 158 | 154 | 155 | 166 |
| Drawing adhesion at 240° C. | | Kg/mm | 1.04 | 1.01 | 1.33 | 1.22 | 1.03 | 1.11 | 1.02 |
| Tg | 72 hr./Disk | % | 0.1248 | 0.1248 | 0.1277 | 0.125 | 0.1477 | 0.1334 | 0.1668 |
| water absorption | 168 hr./Disk | % | 0.1796 | 0.1788 | 0.1843 | 0.1765 | 0.2127 | 0.1907 | 0.2403 |
| | 336 hr./Disk | % | 0.2141 | 0.2125 | 0.224 | 0.2077 | 0.2481 | 0.2223 | 0.2805 |
| Bending at room | Strength | Kg/mm$^2$ | 15.5 | 15.2 | 15.2 | 14.6 | 15.6 | 13.6 | 15.1 |
| temperature | Elastic modulus | Kg/mm$^2$ | 2520 | 2470 | 2587 | 2466 | 2628 | 2409 | 2460 |
| R.T. | Deflection | | 0.0074 | 0.00734 | 0.00694 | 0.00711 | 0.00702 | 0.00659 | 0.00719 |
| Bending at 240° C. | Strength | Kg/mm$^2$ | 2.47 | 2.46 | 2.04 | 2.19 | 2.41 | 1.1 | 1.86 |
| | Elastic modulus | Kg/mm$^2$ | 308 | 295 | 257 | 254 | 277 | 105 | 256 |
| | Deflection | | 0.008 | 0.00836 | 0.00798 | 0.00863 | 0.00877 | 0.0106 | 0.00727 |
| Solder Cracking | Water absorption | % | 0.24 | 0.22 | 0.21 | 0.23 | 0.22 | 0.20 | 0.25 |
| 168 hr. | Inner crack | % | 0 | 0 | 0 | 0 | 20 | 20 | 60 |
| | Outer crack | % | 0 | 0 | 0 | 0 | 0 | 0 | 0 |

Examples 11 to 14 and Comparative Examples 6

The same evaluations as in Table 1, 2 were conducted, except that the evaluation was conducted under conditions of 80° C.×humidity 60% in the moisture absorption test. The volume resistance was measured according to JIS K6911. Moisture absorption in the volume resistance test was conducted using a pressure cooker tester at 121° C. and 2 atom.

immediately immersed in a solder bath at 240° C. for 30 seconds, and whether package crack occurred or not was investigated by a ultrasonic insure detecting apparatus. The outer crack represents the case in which crack occurred in inner portion reaches to outer surface of the package, and the inner crack represents the case in which no crack is recognized on the package by observation from outside but crack occurred in inner portion.

TABLE 3

| | | | Example | | | | Comparative example |
|---|---|---|---|---|---|---|---|
| | | | 11 | 12 | 13 | 14 | 6 |
| Filler content (% by weight) | | | 82 | 84 | 85 | 86 | 82 |
| Epoxy 1 | | | 50 | 50 | 50 | 50 | — |
| Epoxy 3 | | | 50 | 50 | 50 | 50 | 100 |
| Phenol novolak | | | 51.98 | 51.98 | 51.98 | 51.98 | 53 |
| TPP | | | 1.5 | 1.5 | 1.5 | 1.5 | 1.5 |
| SH-6040 | | | 2.5 | 2.8 | 2.9 | 3.2 | 2 |
| Carnauba wax | | | 1.8 | 2.1 | 2.2 | 2.3 | 1.5 |
| Fused silica | | | — | — | — | — | 557.6 |
| Crushed silica | | | — | — | — | — | 139.4 |
| Mixed silica | | | 691.8 | 797.3 | 860.5 | 932.9 | — |
| Spiral flow | | | 71 | 71 | 58 | 56 | 30 |
| Barcole hardness | | | 87 | 87 | 85 | 88 | 88 |
| Tg | DMA (tan δ) | ° C. | 165 | 163 | 164 | 162 | 166 |
| Drawing adhesion under heat | | Kg/mm | 1.1 | 1.35 | — | 1.02 | 0.5 |

TABLE 3-continued

|  |  |  | Example | | | | Comparative example |
|---|---|---|---|---|---|---|---|
|  |  |  | 11 | 12 | 13 | 14 | 6 |
| Tg | 24 hr./Disk | % | 0.0938 | 0.0834 | 0.0825 | 0.075 | 0.0803 |
| water | 48 hr./Disk | % | 0.1272 | 0.1171 | 0.1141 | 0.1038 | 0.1196 |
| absorption | 168 hr./Disk | % | 0.1984 | 0.1862 | 0.1728 | 0.1666 | — |
| Volume resistance | In drying at room temperature | Ω | 2.3E+17 | 1.6E+17 | 2.2E+17 | 1.6E+17 | 2.3E+17 |
|  | 120° C. | Ω | 9.1E+16 | 8.6E+16 | 1.1E+17 | 9.3E+16 | 1.2E+16 |
|  | 150° C. | Ω | 7.0E+16 | 6.9E+16 | 6.7E+16 | 6.3E+16 | 6.3E+16 |
|  | 100 hours after moisture absorption | Ω | 7.7E+15 | 1.0E+16 | — | 8.6E+15 | — |
| Bending at room temperature R.T. | Strength | Kg/mm$^2$ | 16.3 | 16.2 | 13.7 | 16.6 | 17.4 |
|  | Elastic modulus | Kg/mm$^2$ | 1789 | 1946 | 1952 | 2009 | 1978 |
|  | Deflection |  | 0.0107 | 0.00966 | 0.00812 | 0.00937 | 0.0102 |
| Bending at 240° C. | Strength | Kg/mm$^2$ | 0.91 | 1.02 | 1.32 | 1.26 | 1.75 |
|  | Elastic modulus | Kg/mm$^2$ | 99 | 125 | 147 | 152 | 167 |
|  | Deflection |  | 0.00912 | 0.00817 | 0.00902 | 0.00833 | 0.0106 |
| Solder Cracking, 2.0 mm thick | Water absorption | % | 0.21 | 0.20 | 0.18 | 0.18 | 0.22 |
|  | Inner crack | % | 0 | 0 | 0 | 0 | 40 |
|  | Outer crack | % | 0 | 0 | 0 | 0 | 60 |
| Solder Cracking, 1.5 mm thick | Water absorption | % | 0.21 | 0.20 | — | 0.18 | 0.22 |
|  | Inner crack | % | 20 | 0 | — | 0 | — |
|  | Outer crack | % | 0 | 0 | — | 0 | 100 |
| Solder Cracking, 2.7 mm thick | Water absorption | % | 0.21 | 0.20 | — | 0.17 | 0.22 |
|  | Inner crack | % | 0 | 0 | — | 0 | 0 |
|  | Outer crack | % | 0 | 0 | — | 0 | 0 |

Reference Example 3

The epoxy 1 and epoxy 3 were mixed, and change in softening point of the resin when the mixing ratio was changed is shown in FIG. 1.

Reference Example 4

The epoxy resin mixtures (only epoxy components) in Examples 8 to 9 did not fusion-bonded, and could be ground and handled easily.

Comparative Reference Example 1

The resin mixture of the epoxy 3 and the epoxy 4 (only epoxy components) in Comparative Example 3 did not maintain definite shape at room temperature, and was a semisolid material in honey-like state. In the epoxy resin in Comparative Example 4, the resin adhere each other at room temperature, and measurement and mixing were difficult.

Example 15 and Comparative Example 7

Figure 2:
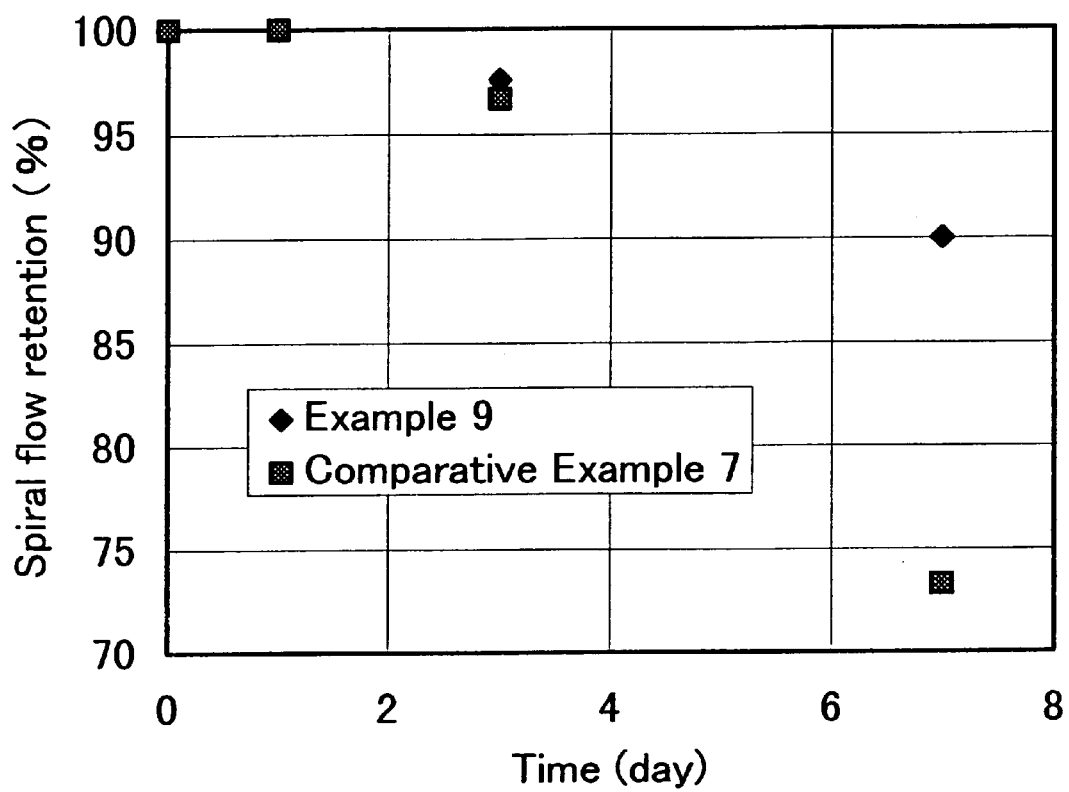
FIG. 2 is a graph showing storage stability of the resin composition of Example 9 and Comparative Example 7.

The resin composition of Example 9 in Table 2 was preserved at 23° C., and values of spiral flow were measured with changing time (Example 15). As Comparative Example 7, measurement was conducted using the resin composition of Comparative Example 3 in Table 2. The change is shown in FIG. 2, regarding spiral flow value directly after preparation of the resin composition as 100.

Examples 16 to 17 and Comparative Example 8

Measurements were conducted in the same manner as in Tables 1 to 3. An aralkylphenol resin (trade name: Milex, manufactured by Mitsui Toatsu Chemicals, Inc.) as the curing agent, triphenylphosphine as the curing accelerator as the curing accelerator, fused silica (grade of the silica is shown below) as the filler, carnauba wax as the mold-releasing agent, and coupling agent (trade name: SH-6040, manufactured by Dow Corning Toray Silicone Co., Ltd.) were compounded in amounts (g) shown in Table 1, and the mixture was kneaded with heating by a roll, then subjected to transfer molding. Further, the molded article was subjected to post curing in an oven at 180° C. for 5 hours to obtain a cured molded article. The physical properties of this cured molded article was measured. The results are shown in Table 4.

TABLE 4

|  | Example | | Comparative example |
|---|---|---|---|
|  | 16 | 17 | 8 |
| Epoxy 1 | 85 | 70 | 100 |
| Epoxy 2 | 15 | 30 | — |
| Aralkylphenol | 81.7 | 82.1 | 80.8 |
| TPP | 3.5 | 3 | 3.5 |
| SH-6040 | 4.4 | 4.4 | 4.4 |
| Carbauba wax | 3.3 | 3.3 | 3.3 |
| Mixed silica | 1355.8 | 1335.5 | 1325.6 |
| Spiral flow inch | 22 | 24 | 29 |
| Barcole hardness | 82 | 86 | 76 |

Example 18 and Comparative Example 9

Molded articles were obtained from the resin compositions shown in Table 5. Thermal decomposition temperatures of the molded articles was measured using TG-DTA (SSC/5200 manufactured by Seiko Instruments Co., Ltd.). The results are shown in Table 5.

TABLE 5

|  | Example 18 | Comparative Example 9 |
|---|---|---|
| Filler (% by weight) | 88 | 88 |
| Epoxy 1 | 50 | — |
| Epoxy 3 | 50 | — |
| Epoxy 5 | — | 100 |
| phenol novolak | 51.98 | 40.15 |
| TPP | 1.5 | 1.5 |
| SH-6040 | 3.7 | 3.39 |
| carnauba wax | 2.8 | 2.55 |
| mixed silica | 1114.5 | 1027.78 |
| Thermal decomposition temperature | 367° C. | 323° C. |

The epoxy resin composition of the present invention maintains excellent molding property and can provide a package without generating a defect even if the amount of the filler is increased. The epoxy resin composition of the present invention has low moisture absorption and other properties balanced for a material for encapsulating electronic parts. Further, a resin encapsulated semiconductor device obtained by using this resin composition is excellent in solder crack resistance.

What is claimed is:

1. An epoxy resin composition comprising:
   (A) an epoxy compound represented by the general formula (1):

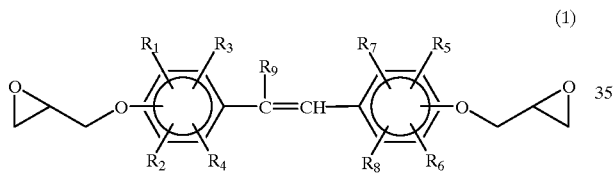

(1)

wherein, $R_1$ to $R_9$ represent each independently a hydrogen atom, an acyclic or cyclic alkyl group having 1 to 6 carbon atoms, a substituted or unsubstituted phenyl group or a halogen atom,
   (B) a glycidyl ether compound of phenol novolaks or a glycidyl ether compound of trisphenolmethane novolaks, and
   (C) an epoxy curing agent containing a phenolic hydroxyl group, wherein the proportion of the epoxy compound (A) is from 20 to 99% by weight based on the total weight of the epoxy compounds (A) and (B).

2. The epoxy resin composition according to claim 1, which further comprises an inorganic filler (D) in an amount of from 25 to 95% by weight based on the weight of the whole resin composition.

3. The epoxy resin composition according to claim 2, wherein the inorganic filler (D) is in an amount of from 50 to 95% by weight based on the weight of the whole resin composition.

4. The epoxy resin composition according to claim 1, wherein the epoxy curing agent containing a phenolic hydroxyl group (C) is an aralkylphenol resin.

5. A resin-encapsulated semiconductor device obtained by encapsulating a semiconductor element using the epoxy resin composition of claim 1 or 2.

6. An epoxy resin composition comprising:
   (A) an epoxy compound represented by the general formula (1):

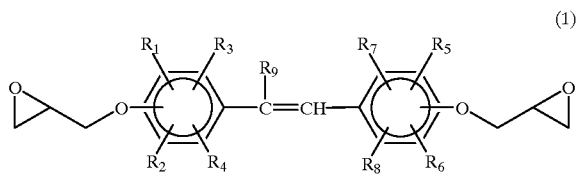

(1)

wherein, $R_1$ to $R_8$ represent each independently a hydrogen atom, an acyclic or cyclic alkyl group having 1 to 6 carbon atoms, a substituted or unsubstituted phenyl group or a halogen atom, and $R_9$ represents an acyclic or cyclic alkyl group having 1 to 6 carbon atoms, a substituted or unsubstituted phenyl group, or a halogen atom;
   (B) a polyfunctional epoxy compound having a functional group number of two or more, and
   (C) an epoxy curing agent containing a phenolic hydroxyl group, wherein the proportion of the epoxy compound (A) is from 0.1 to 99% by weight based on the total weight of the epoxy compounds (A) and (B).

* * * * *